(12) United States Patent
Gass

(10) Patent No.: US 7,039,839 B2
(45) Date of Patent: May 2, 2006

(54) METHOD AND APPARATUS FOR ENHANCED PARALLEL PORT JTAG INTERFACE

(75) Inventor: Lawrence H. Gass, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 478 days.

(21) Appl. No.: 10/325,734

(22) Filed: Dec. 23, 2002

(65) Prior Publication Data

US 2004/0123193 A1    Jun. 24, 2004

(51) Int. Cl.
*G01R 31/28* (2006.01)

(52) U.S. Cl. ....................................... 714/724

(58) Field of Classification Search ............... 714/724, 714/712, 746, 748, 749, 43, 56, 25, 44, 46
See application file for complete search history.

(56) References Cited

U.S. PATENT DOCUMENTS

| | | | | |
|---|---|---|---|---|
| 6,002,882 A | * | 12/1999 | Garde | 712/35 |
| 6,009,270 A | * | 12/1999 | Mann | 717/128 |
| 6,185,732 B1 | * | 2/2001 | Mann et al. | 717/128 |
| 6,813,674 B1 | * | 11/2004 | Velasco et al. | 710/311 |

OTHER PUBLICATIONS

"IEEE Standard Test Access Port and Boundary-Scan Architecture", (IEEE Std. 1149.1-2001), Test Technology Standards Committee of the IEEE Computer Society, (2001), 208 pgs.

"Intel™ System Architecture", *PXA250 and PXA210 Application Processors Developer's Manual*, 2-1 through 3-1, 41 pgs.

"Warp Nine Engineering: EPP Mode", http://www.fapo.com/eppmode.htm, (Observed Apr. 2, 2002), 4 pgs.

* cited by examiner

*Primary Examiner*—Christine T. Tu
(74) *Attorney, Agent, or Firm*—Ram P. Yadav

(57) ABSTRACT

A method and apparatus for an enhanced parallel port JTAG interface (IEEE Test Access Port) that includes a clock signal line where the clock signal line is a delayed and inverted version of a data strobe signal line. A data input signal line, a data output signal line, a mode select signal line, and a wait signal line are also include. The wait signal line is a delayed and inverted version of the data strobe signal line. The enhanced JTAG cable is connectable between an Enhanced Parallel Port (EPP) and a JTAG port and has increased performance over using a Standard Parallel Port (SPP).

20 Claims, 7 Drawing Sheets

| | | | |
|---|---|---|---|
| Vtref | 1 | 2 | Vcc |
| | 3 | 4 | GND |
| TDI | 5 | 6 | GND |
| TMS | 7 | 8 | GND |
| TCK | 9 | 10 | GND |
| | 11 | 12 | GND |
| TDO | 13 | 14 | GND |
| nSReset | 15 | 16 | GND |
| | 17 | 18 | GND |
| | 19 | 20 | GND |

FIG 3

METHOD AND APPARATUS FOR ENHANCED PARALLEL PORT JTAG INTERFACE

BACKGROUND

1. Field of the Invention

The present invention is related to JTAG interfaces and more specifically to communicating to a JTAG interface using an Enhanced Parallel Port.

2. Background Information

Some processors provide an interface to allow external control or input into the processor's core logic for debug or downloading of information. One such interface is a Joint Test Action Group (JTAG) interface that allows a form of communication to an external device for debugging or programming of internal memory on the processor. The JTAG interface is an Institute for Electrical and Electronic Engineers (IEEE) Standard 1149.1 interface. In the IEEE 1149.1 specification this interface is referred to as a Test Access Port (TAP). A host device may be connected to the JTAG interface of a target device (e.g., processor) using the parallel port of the host device. The simplest form of host-to-target interface is that for every bit on JTAG, one byte is transferred on a parallel port in Standard Parallel Port (SPP) mode. Generally, during JTAG interface operation a data in clock is sent along with each byte of data transmitted. Since an instruction is needed for every byte sent, to send 10 bytes of data, 10 instructions are needed. This can be problematic in that this process is slow in both a debug mode as well as in a memory programming mode.

Currently, since a parallel port in SPP mode is used to send information across to a target device's JTAG interface, in order to send a bit across the JTAG port in SPP mode, software at the host must make three port accesses.

Therefore, there is a need for a faster and more efficient way to transfer information to a JTAG interface (i.e., Test Access Port).

BRIEF DESCRIPTION OF THE DRAWINGS

The present invention is further described in the detailed description which follows in reference to the noted plurality of drawings by way of non-limiting examples of embodiments of the present invention in which like reference numerals represent similar parts throughout the several views of the drawings and wherein:

FIG. 3 shows a diagram of an example JTAG connector for use with a JTAG cable according to an example embodiment of the present invention;

DETAILED DESCRIPTION

The particulars shown herein are by way of example and for purposes of illustrative discussion of the embodiments of the present invention. The description taken with the drawings make it apparent to those skilled in the art how the present invention may be embodied in practice.

Further, arrangements may be shown in block diagram form in order to avoid obscuring the invention, and also in view of the fact that specifics with respect to implementation of such block diagram arrangements is highly dependent upon the platform within which the present invention is to be implemented, i.e., specifics should be well within purview of one skilled in the art. Where specific details (e.g., circuits, flowcharts) are set forth in order to describe example embodiments of the invention, it should be apparent to one skilled in the art that the invention can be practiced without these specific details. Finally, it should be apparent that any combination of hard-wired circuitry and software instructions can be used to implement embodiments of the present invention, i.e., the present invention is not limited to any specific combination of hardware circuitry and software instructions.

Although example embodiments of the present invention may be described using an example system block diagram in an example host unit environment, practice of the invention is not limited thereto, i.e., the invention may be able to be practiced with other types of systems, and in other types of environments.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1:
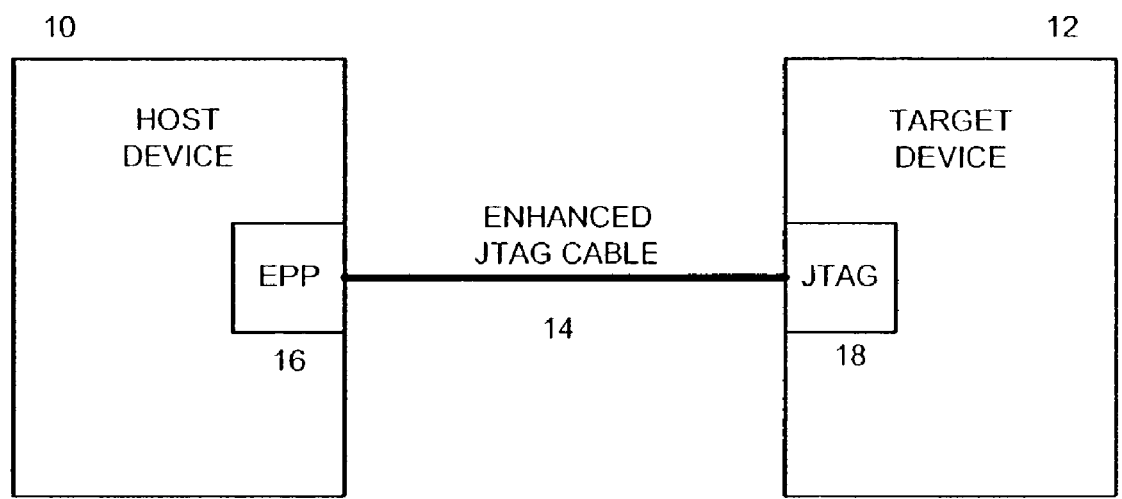
FIG. 1 shows a block diagram of an example system with an enhanced parallel port JTAG interface according to an example embodiment of the present invention.

FIG. 1 shows a block diagram of an example system with an enhanced parallel port JTAG interface according to an example embodiment of the present invention. A host device 10 may communicate to a target device 12 via a parallel port on the host device running in enhanced parallel port (EPP) mode 16 using an enhanced JTAG cable 14 connected to a JTAG interface 18 of the target device 12. EPP mode allows up to four bytes to be transferred with one instruction. The present invention allows communication to an IEEE 1149.1 JTAG test access port using an enhanced parallel port. According to the present invention, the EPP hardware on the host device 10 automatically sequences the data strobe signal and provides the advantage of increased speed over using a parallel port in Standard Parallel Port (SPP) mode. The speed advantage allows more efficient use in computer system debug and low-level system activities such as in-system-programming of memory devices at the target device (e.g., flash memories).

Figure 2:
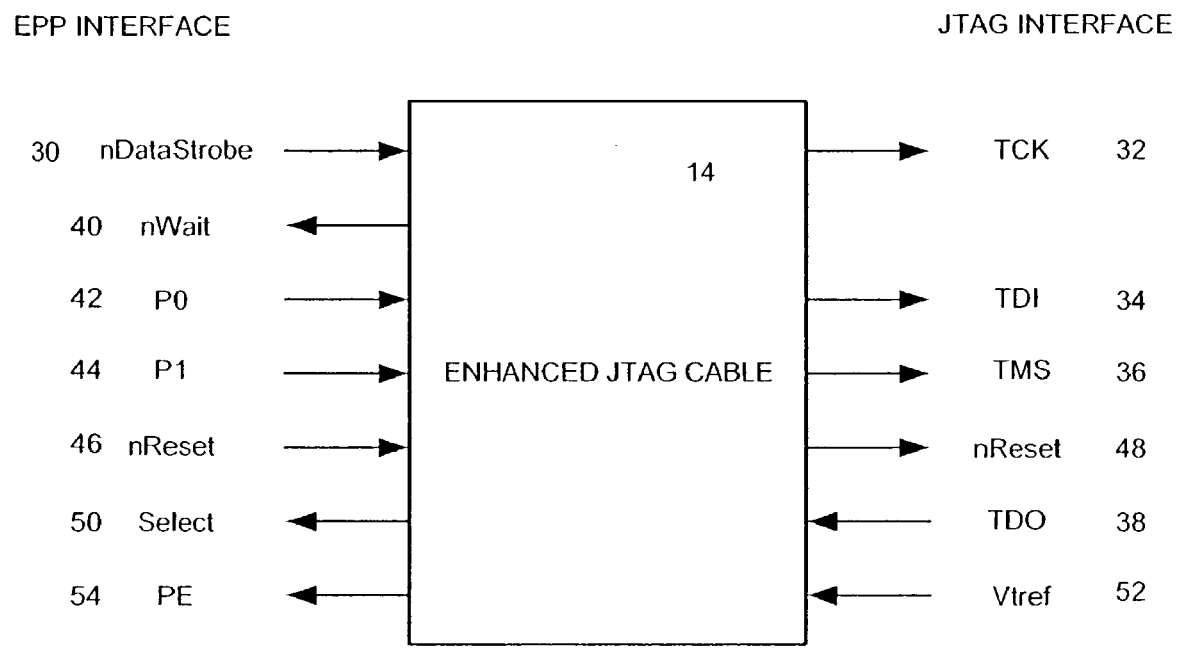
FIG. 2 shows a diagram of the ends of an enhanced JTAG cable according to an example embodiment of the present invention.

FIG. 2 shows a diagram of the ends of an enhanced JTAG cable according to an example embodiment of the present invention. An enhanced JTAG cable 14 may be connected between an EPP interface and a JTAG interface. The cable 14 EPP interface end may include a data strobe signal 30, a wait signal 40, two signal lines for receiving data 42, 44, a reset signal 46, a select signal 50, and a power enabled indicator signal 54. The data strobe signal 30, data signals 42, 44, and reset signal 46 may be sent from the EPP interface through the enhanced JTAG cable 14 to the JTAG interface. The EPP interface wait signal 40, select signal 50, and power enabled signal 54 may be received at the EPP interface through the enhanced JTAG cable 14 from the JTAG interface.

The enhanced JTAG cable 14 also includes a JTAG interface end that may include a test clock 32, a test data input signal 34, a test mode select signal 36, a reset signal 48, a test data out signal 38, and a voltage reference signal 52. The test clock signal 32, test data input signal 34, test mode select signal 36, and reset signal 48 may be sent from the EPP interface through the enhanced JTAG cable to the JTAG interface. The test data output signal 38 and voltage reference signal 52 may be sent from the JTAG interface through the enhanced JTAG cable to the EPP interface.

FIG. 3 shows a diagram of an example JTAG connector for use with a JTAG cable according to an example embodiment of the present invention. In this example embodiment, a connector 60 has twenty pins which include pins for the six signal lines discussed previously on the JTAG interface, one power (Vcc) pin, and nine ground (GND) pins. In this example embodiment, the power pin is pin 2 however, some target systems may not have power connected to pin 2 therefore requiring minor hardware modifications to the cable. These modifications may be as simple as connecting pin 1 (voltage reference) to pin 2. In other cases, an external power supply may be needed. The pins associated with the particular signals shown in FIG. 3 are shown for illustrative purposes and the present invention is not limited by the use of these specific pins for the associated signal lines shown in FIG. 3.

Figure 4:
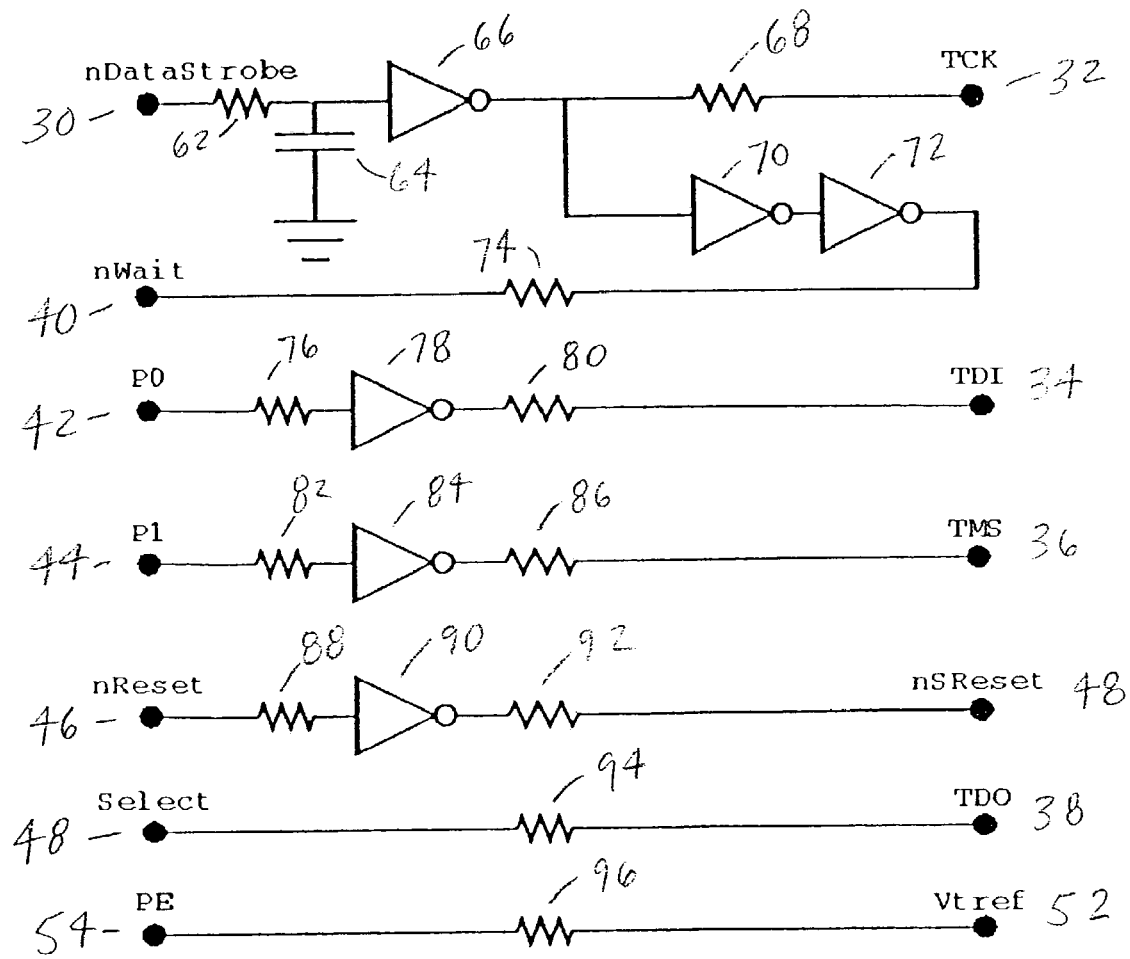
FIG. 4 shows a schematic diagram of an enhanced JTAG cable according to an example embodiment of the present invention.

FIG. 4 shows a schematic diagram of an enhanced JTAG cable according to an example embodiment of the present invention. The left side of the schematic diagram represents connections to the EPP interface and the right side of the schematic diagram represents connections to the JTAG interface. According to the present invention, a test clock 32 may be formed from an inverted and delayed data strobe signal 30 from the EPP. The test data input 34 and test mode select 36 may be generated from the parallel data signals 42, 44. Further, the test data output signal 38 may be sent from the JTAG interface to any of the EPP user defined inputs 48. The wait signal 40 may be generated also from a delayed version of the data strobe signal 30.

In this embodiment of the present invention, a data strobe signal 30 from the EPP may be sent through an resistor-capacitor (RC) network 62, 64, an inverter device 66, and a resistance 68 and be received at a JTAG interface as a test clock 32. Resistor-capacitor (RC) network 62, 64, and inverter device 66, together, form a delay device. As note previously, a wait signal 40 may also be generated from a delayed version of the data strobe signal 30. In this regard, the data strobe 30 may be delayed by inverter devices 66, 70 and 72 and pass through a resistance 74 to form the wait signal 40.

A test data input signal 34 at the JTAG interface side of the cable may be formed from one of the data outputs 42 from the EPP interface passing through a pair of resistances 76, 80 that may reside on either side of a delay device 78. Similarly, a test mode select signal 36 may be formed from a data output 44 from the EPP interface that passes through resistances 82, 86 on the input and output sides of a delay device 84.

A reset signal 46 may be sent from the EPP interface through a resistance 88, delay device 90, second resistance 92 and received at the JTAG interface as a reset signal 48. The test data output signal 38 may be generated at a JTAG interface, passed through a resistance 94 and received at the EPP interface as a select signal 48. A voltage reference signal 52 may also originate at the JTAG interface, be passed through a resistance 96 and be received at the EPP interface as a power enable signal 54.

Figure 5:
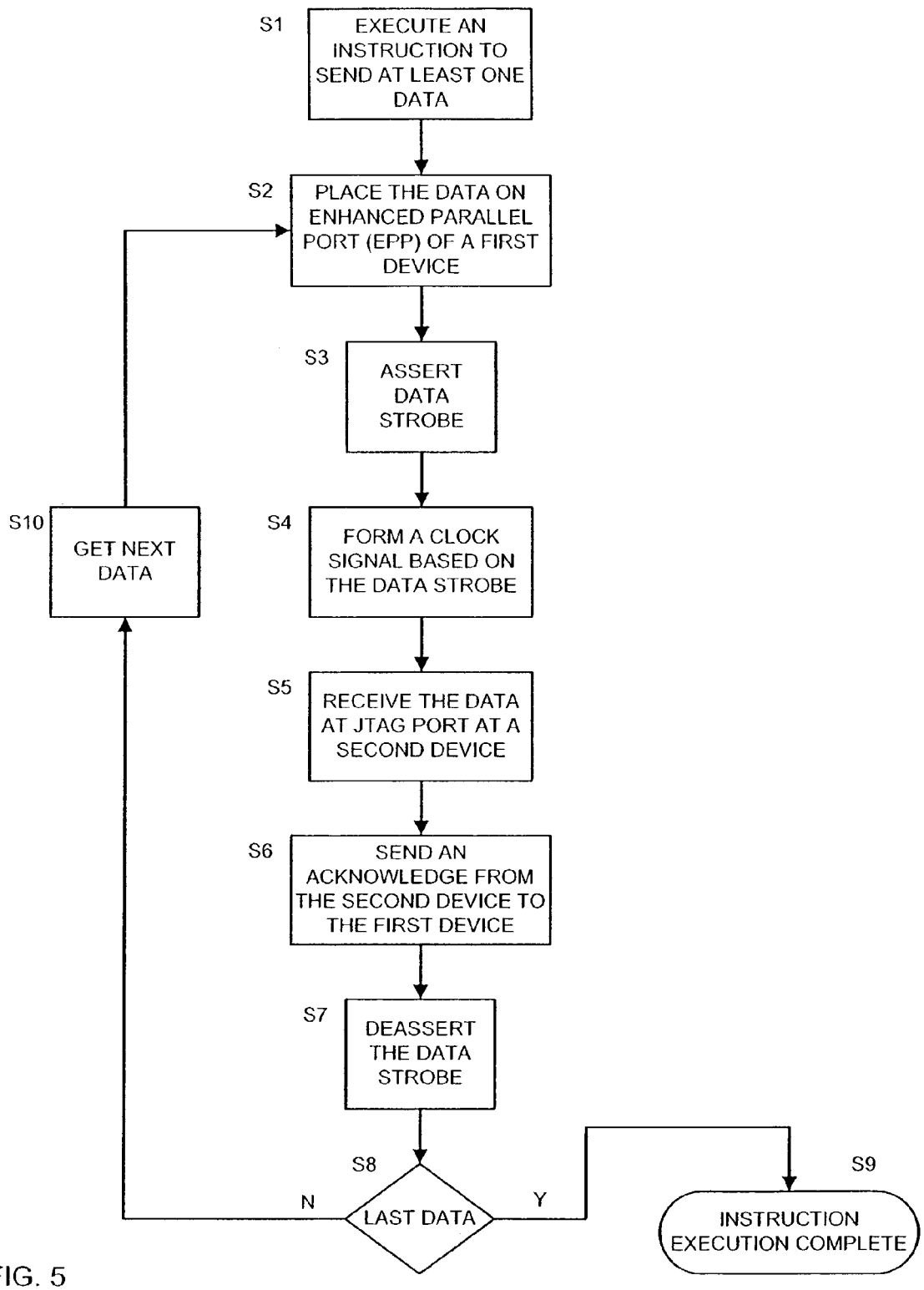
FIG. 5 is a flowchart of a process for an enhanced parallel port JTAG interface according to an example embodiment of the present invention.

FIG. 5 is a flowchart of a process for an enhanced parallel port JTAG interface according to an example embodiment of the present invention. An instruction is executed on the host to send one or more data S1. The data is placed on the enhanced parallel port of a first device S2. A data strobe is asserted S3. A clock signal is formed based on the data strobe S4. The data is received at a JTAG port of a second device S5. An acknowledge signal from the second device is sent to the first device S6. The data strobe is de-asserted S7. It is determined if this is the last data to be sent regarding the instruction S8, and if so, the instruction execution is complete S9. If this is not the last data to be sent, the next data is obtained S10 and placed on the enhanced parallel port of the first device S2. The process then repeats until all data has been sent based on the instruction.

Figure 6:
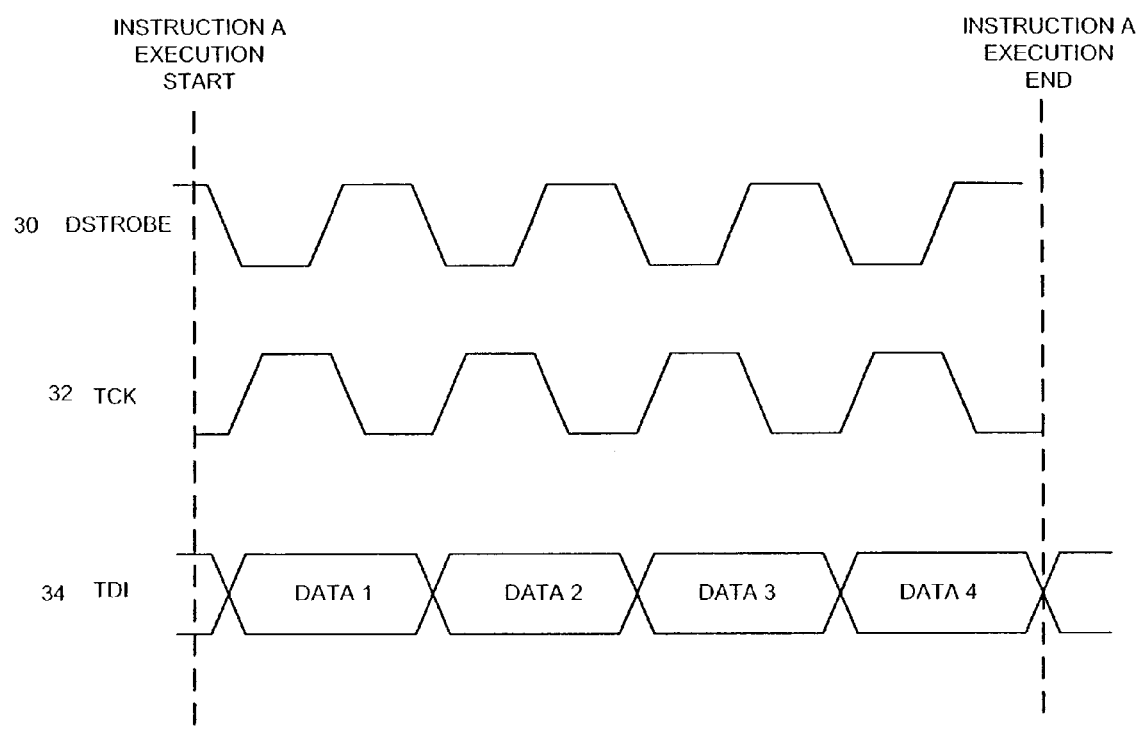
FIG. 6 shows a timing diagram of an enhanced parallel port JTAG interface according to an example embodiment of the present invention.

FIG. 6 shows a timing diagram of an enhanced parallel port JTAG interface according to an example embodiment of the present invention. As shown in the figure, an instruction A once executed may cause a data strobe signal 30 to be asserted. In this example embodiment, the data strobe signal 30 is an active low signal. Once the data strobe signal has been asserted, on the following rising edge of a test clock 32, data may be clocked out of the EPP interface on the test data input signal line 34. The data strobe signal 30 will continue to be asserted for each data to be transmitted associated with execution of instruction A. In this example embodiment, there are four data to be transferred based on the execution of instruction A. Once all data has been transferred on the test data input line 34, the data strobe signal 30 becomes inactive, and the execution of instruction A will have been completed. Therefore, according to the present invention, multiple data may be transferred upon execution of a single instruction at the EPP interface.

Figure 7:
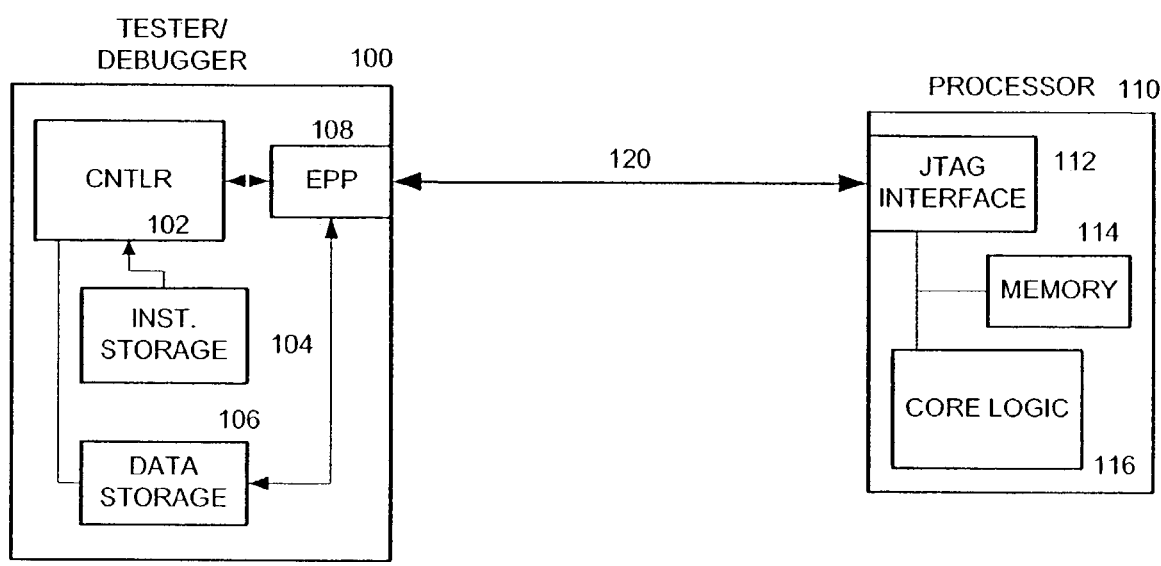
FIG. 7 shows a diagram of an example system using an enhanced parallel port JTAG interface according to an example embodiment of the present invention.

FIG. 7 shows a diagram of an example system using an enhanced parallel port JTAG interface according to an example embodiment of the present invention. A host device 100 (e.g., tester, debugger, etc.) may include a controller 102, an instruction storage 104, and data storage 106, along with an EPP interface 108. Host device 100 may be connected to a target device 110 (e.g., processor) via an enhanced JTAG cable 120. The enhanced JTAG cable 120 may connect the EPP 108 of the host device 100 to a JTAG interface 112 of the target device 110. The target device 110 may also include memory 114 and core logic 116. Host device 100 may use EPP interface 108 and enhanced JTAG cable 120 to debug target device 110 and/or program or load information into memory 114. Use of enhanced JTAG cable 120 according to the present invention allows more efficient and faster debug/downloading of information, boundary scan, and other JTAG test mode operations to target device 110 by host device 100.

An enhanced JTAG cable according to present invention is advantageous in that it allows faster transfer of information as compared with using normal parallel port JTAG cables that use standard parallel port (SPP) mode. According to the present invention, using EPP mode, only one port access is required versus three port accesses when using conventional SPP mode, since according to the present invention, the EPP hardware automatically sequences the data strobe signal.

It is noted that the foregoing examples have been provided merely for the purpose of explanation and are in no way to be construed as limiting of the present invention. While the present invention has been described with reference to a preferred embodiment, it is understood that the words that have been used herein are words of description and illustration, rather than words of limitation. Changes may be made within the purview of the appended claims, as presently stated and as amended, without departing from the scope and spirit of the present invention in its aspects. Although the present invention has been described herein with reference to particular methods, materials, and embodiments, the present invention is not intended to be limited to the particulars disclosed herein, rather, the present invention extends to all functionally equivalent structures, methods and uses, such as are within the scope of the appended claims.

What is claimed is:

1. An enhanced Joint Test Action Group (JTAG) cable comprising:
    a clock signal line, the clock signal line being a delayed and inverted version of a data strobe signal line;
    a data input signal line;
    a data output signal line;
    a mode select signal line; and
    a wait signal line, the wait signal line being a delayed and inverted version of the data strobe signal line,
    wherein the enhanced JTAG cable is connectable between an Enhanced Parallel Port (EPP) and a JTAG port.

2. The cable according to claim 1, further comprising a reset signal line.

3. The cable according to claim 1, further comprising a voltage reference signal line.

4. The cable according to claim 1, wherein the Enhanced Parallel Port (EPP) exists on a first device and the JTAG port exists on a second device.

5. The cable according to claim 4, wherein the first device is a system debug device.

6. The cable according to claim 4, wherein the second device is a processor.

7. The cable according to claim 1, wherein the clock signal line is connectable between a data strobe on a first device and a clock on a second device.

8. The cable according to claim 1, wherein the data input signal line is connectable between a data line on a first device and a test data input on a second device.

9. The cable according to claim 1, wherein the data output signal line is connectable between a select on a first device and a test data output on a second device.

10. The cable according to claim 1, wherein the mode select signal line is connectable between a data line on a first device and a test mode select on a second device.

11. A method for an enhanced Joint Test Action Group (JTAG) connection comprising:
    executing an instruction to send at least one data;
    placing the data on an Enhanced Parallel Port (EPP) of a first device;
    asserting a data strobe;
    forming a clock signal based on the data strobe;
    receiving the data at a JTAG port at a second device;
    sending an acknowledge from the second device to the first device;
    de-asserting the data strobe; and
    repeating the placing through de-asserting steps until all data has been transferred.

12. The method according to claim 11, further comprising forming the clock signal by delaying and inverting the data strobe.

13. The method according to claim 11, further comprising sending a reset from the first device to the second device before the executing step.

14. The method according to claim 11, receiving the data at the second device for testing or debug of the second device.

15. The method according to claim 11, receiving the data at the second device for programming memory at the second device.

16. A system for enhanced Joint Test Action Group (JTAG) communication comprising:
    a host device, the host device containing an Enhanced Parallel Port (EPP);
    a target device, the target device containing a JTAG port; and
    a cable interconnected between the EPP on the host device and the JTAG port on the target device,
    wherein when an instruction is executed at the host device to send at least one data to the target device, data is placed on the EPP, a data strobe is asserted, a clock signal is formed based on the data strobe, the data is received at the JTAG port, an acknowledge is sent from the target device to the host device, the data strobe is de-asserted, and this is all repeated until all data has been transferred based on the instruction.

17. The system according to claim 16, wherein the host device is a test and debug device.

18. The system according to claim 16, wherein the target device is a processor.

19. The system according to claim 16, wherein the processor contains a memory, the at least one data being used to program the memory.

20. The cable of claim 1 comprising
    a JTAG interface end with the clock signal line, the data input signal line, the data output signal line and the mode select line, and
    a Enhanced Parallel Port (EPP) interface end with the data strobe signal line, the wait signal line, a select signal line associated with the data output signal line of the JTAG interface end and a data signal associated with the data input signal line of the JTAG interface end.

* * * * *